Feb. 7, 1967 W. B. ZELINA 3,303,392

COOLING ARRANGEMENT FOR ELECTRONIC DEVICES

Filed Sept. 10, 1963 2 Sheets-Sheet 1

INVENTOR.

WILLIAM B. ZELINA

BY attorney

INVENTOR.
WILLIAM B. ZELINA
BY
Chas. L. Lowenhead
atty

United States Patent Office 3,303,392

Patented Feb. 7, 1967

3,303,392

COOLING ARRANGEMENT FOR ELECTRONIC DEVICES

William B. Zelina, Erie, Pa., assignor to General Systems, Inc., Erie, Pa., a corporation of Pennsylvania Filed Sept. 10, 1963, Ser. No. 307,884
9 Claims. (Cl. 317—100)

This invention relates to cooling devices and, more particularly, to apparatus for cooling electronic components such as solid state components of voltage regulators.

With the advent of solid state electronic devices, the need arises for efficient means of removing heat from a relatively small surface area on the device. This surface area in the present instance is the actual mounting base of the device. The heat sink problem has been solved in the past by simple direct mounting of the components to large convenient metal structures when possible. Where these large metal sections could be tolerated at device electrical potential, this approach is adequate.

In present power devices, one surface of the junction, the junction being where the heat is generated, is physically attached to the mounting base of the device to minimize thermal impedance from the semi-conductor junction to the mounting base and, ultimately, to some heat sink on which the device is mounted. The thermal impedance from the junction to the mounting base is controlled by the device manufacturers and there is little that the user can do to change it; however, removing the heat from the mounting base and dissipating it to the ambient in which the device is to operate is completely in the hands of the user. Furthermore, since the mounting base is at the same potential as one side of the junction, simply mounting the device to some large metal structure such as the chassis of the system does not suffice because this structure now becomes the same electrical potential as the mounting base side of the junction.

Many versions of insulating washers have evolved to provide electrical isolation for the above type of mounting. Because of the small area of the mounting base, these washers introduce prohibitive thermal impedance for applications where the full capacity of the device is desired. These washers also create a questionable creppage problem for environments where a large accumulation of conductive dirt is present. The introduction of insulating washers in general is not a satisfactory solution for electrical insulation even though the practice widely exists.

The general problem of questionable creepage for dirty environments applies equally to the semi-conductor devices themselves. Because of their small size, these semiconductor devices violate every long respected rule for minimum creepage in industrial environments. Further, because of the electrical sensitivity of these devices, even relatively high impedance creepage paths can often seriously impair the proper operation of the device.

The general problem of creepage control on components is solved by mounting all creepage sensitive components in the enclosure which provides a dust or dirt shield. It will be noted from FIGS. 1 and 2 that when the assembly is closed by a top and a bottom compatible with the type of mounting used, the resultant structure completely encloses the circuitry that would normally be susceptible to creepage. It is also noted that the resistors which are major heat producers are so located as to dissipate their heat external to the enclosure.

The resultant enclosure also serves as an effective shield for electro-magnetic and electro-static fields. There are two problem areas associated with electric fields. First, in many applications, a rapidly changing field could couple into an exposed circuit and cause system malfunction or failure. An example could be if this circuit operates adjacent a heavy current carrying contactor. In the second case, system generated rapidly changing fields could radiate from an exposed circuit and cause interference or malfunction of some adjacent system such as a radio. Both problems are completely solved by the herein described enclosure arrangement.

The capacitor clamp disclosed serves as a highly vibration resistant clamping arrangement as well as a heat sink for the capacitors, i.e., the capacitors are held essentially at the enclosure temperature. The left and right hand sections of the enclosures are hinged to provide maximum accessibility to the components. In FIG. 5, an enlarged end view of the capacitor clamp is shown. The same capacitor clamp is illustrated diagrammatically in FIG. 1.

The heat sink disclosed has the following specific advantages:

(1) A means of packaging electronic components which allows the entire package to act as a heat sink;

(2) A heat sink means for cooling electronic components which provide substantial electrical insulation between the heat sink and the components with negligible thermal impedance introduced in the system; and (3) A means for joining two metal sections such that electrical insulation is effected between the two sections using a casting compound wherein the casting compound is not required to provide high tensile strengths.

More particularly, it is an object of the present invention to provide an improved heat sink.

Another object of the invention is to provide a heat sink in combination with a solid state electronic circuit.

Still another object of the invention is to provide a combination heat sink and dust shield.

Yet another object of the invention is to provide a heat sink wherein a main section and a support section are disposed in spaced relation to each other with a high heat conductivity, electrical insulation material disposed therebetween and bonding said sections together.

A further object of the invention is to provide a heat sink which is simple in construction, economical to manufacture, and simple and efficient to use.

With the above and other objects in view, the present invention consists of the combination and arrangement of parts hereinafter more fully described, illustrated in the accompanying drawings and more particularly pointed out in the appended claims, it being understood that changes may be made in the form, size, proportions, and minor details of construction without departing from the spirit or sacrificing any of the advantages of the invention.

Figure 2:
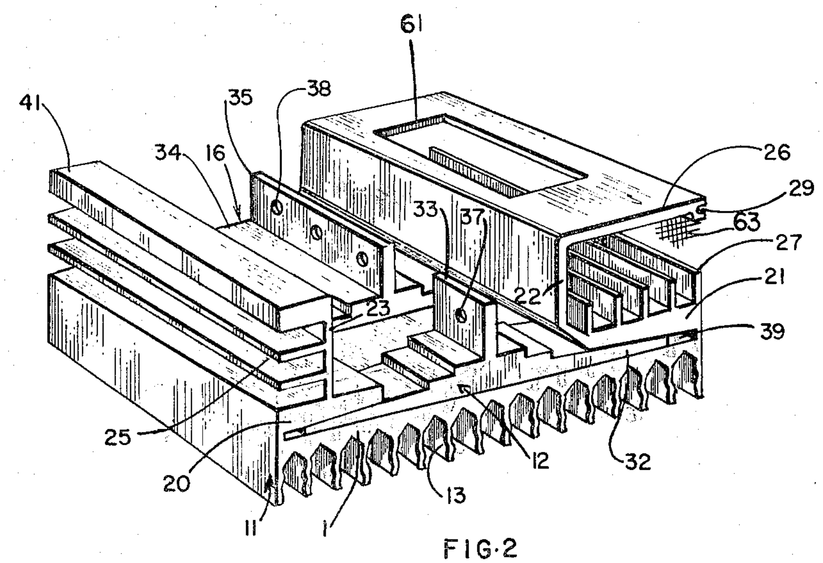
FIG. 2 is an isometric view of the main section and support section of the heat sink with the other parts removed.
Figure 1:
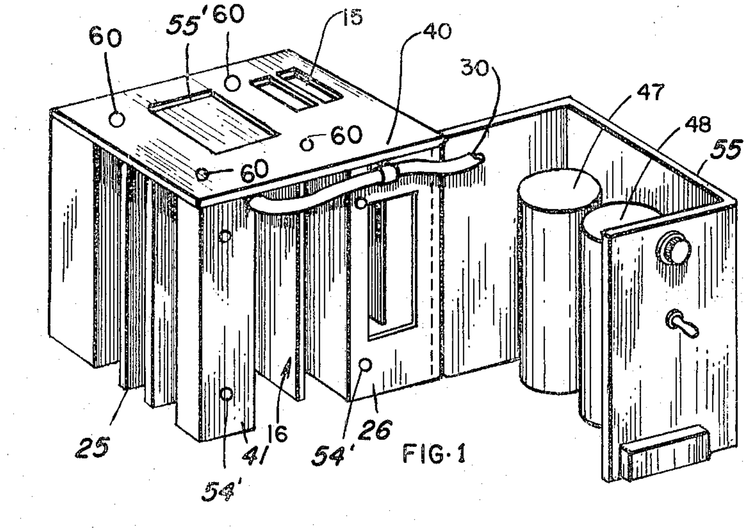
FIG. 1 is a view of a heat sink according to the invention with a terminal board resting on the top thereof and the closure section swung open from the main section.
Figure 3:
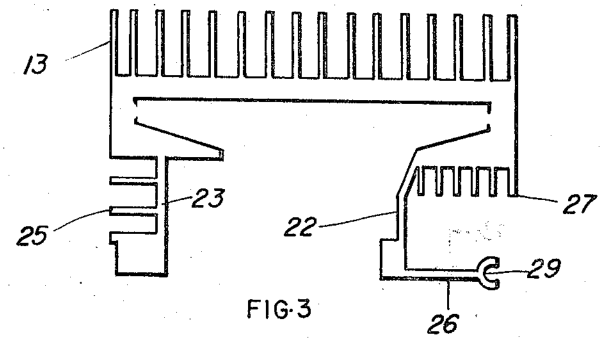
FIG. 3 is an end view of the part of the heat sink shown in FIG. 2.
Figure 4:
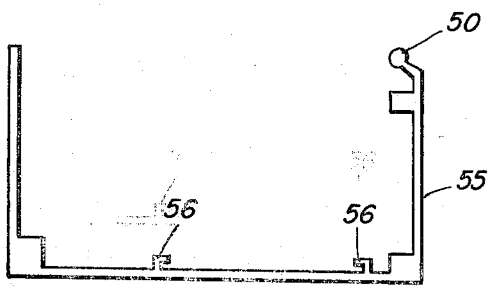
FIG. 4 is an end view of the part shown at the right of FIG. 1.
Figure 5:
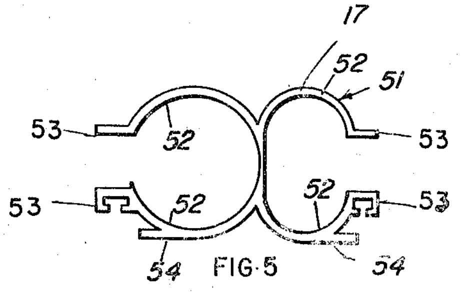
FIG. 5 is a view of the capacitor clamp.
Figure 6:
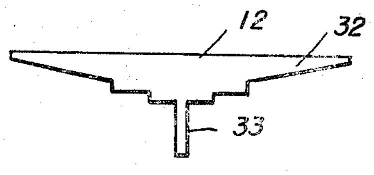
FIG. 6 is an end view of a support for isolating certain components from the container.

Now with more particular reference to the drawings, a heat sink is shown with a main section 11 and support sections 12 and 16 which are made of proportionate size to the heat which is to be dissipated from the components attached to each of them.

The main section and support sections are made of high heat conductivity electrical conducting material. The main section 11 has a main support side which has a flat internal surface 1 and radiused fins 13 integrally attached to the outside thereof. These fins have a thickened base portion and they are curved along longitudinal lines as shown.

Lateral members 20 and 21 overlie the flat internal surface 1 of the main support section 11 and the members 20 and 21 define a groove between them and the internal surface 1. The flat lower surfaces of the lateral members 20 and 21 diverge slightly inwardly and away from the flat internal surface 1 of the support member.

Side portions 22 and 23 extend upwardly from the lateral members 20 and 21 and from the flat internal surface generally perpendicular therefrom. Fins 25 are integrally attached to the side portion 23 and fins 27 are integrally attached to the upper sides of the lateral member 21.

The radiused fins 13 provide a theoretical maximum of fifty-seven percent more surface area than plain fins. Actually, about forty percent is the practical maximum. These sections may all be made of high conductivity aluminum so that the entire enclosure acts as a heat sink.

The problem of insulating the devices from the enclosure is solved by completely encapsulating the section 12 into the corresponding dove-tailed groove between the surface 1 and the members 20 and 21. Because of the very large surface area that exists across the insulating surface 1 and the bottom surface of the members 20 and 21 and because of the high thermal conductivity epoxy used to attach the section 12 in the groove, the thermal impedance that is introduced by this insulating arrangement is completely negligible. Where two or more devices in a system must also be insulated from each other, section 12 is simply cut into sections 12 and 16 and separated as shown in FIG. 2, keeping the respective lengths of sections 12 and 16 approximately proportional to the watts to be dissipated by each section with consideration given to the maximum junction temperature of the devices being cooled on the respective sections.

The support sections 12 and 16 are generally T-shaped. The section 12 has a bar 32 and a stem 33 while the section 16 has a bar 34 and a stem 35. Holes 37 and 38 are formed in the stems 33 and 35 and in these holes are atttached electrical components such as transistors, silicon controlled rectifiers, and other electronic components. It will be noted that the bars 32 and 34 are thickened at the center and stepped so that heat is carried outward toward the outer ends and dissipated.

A space 39 around the groove between the support sections and the main section is filled with an epoxy resin which is a good heat conductor but an electrical insulator. Therefore, it insulates the sections from each other.

A component 40 is shown removed from its assembled position and resting on top of the main support section 11. The component 40 is made of fiberglass material with required electronic components 55′ of the voltage regulator circuit attached thereto.

Condensers 47 and 48 are attached to a cover 30 by means of a capacitor clamp 51. The capacitor clamp 51 is made up of an integral member which defines two generally cylindrical enclosures held back to back. Legs 52 which define the cylindrical cavities have ends 53 which can be clamped together and sides 54 are flat and can be bonded to a dust shield 55 or the ends can be slid behind lugs 56.

In use, the component 40 is attached to flanges 41 and 26 by means of screws inserted through holes 60 and received in threaded holes 54′. The capacitor clamp 51 is attached behind the lugs 56 and a cylindrical member 50 is inserted at 29. The dust shield 55 can be closed to eliminate dust. The sections 12 and 16 will be bonded in place and heat from the components in the device will be dissipated by fins 13, 25, and 27.

The flange 26 has a rectangular opening 61. Resistors 15 are attached to the component 40 in position so that they are disposed in the opening 61 when the component is in operative position. This has the advantages that the resistors mounted on the component 40 complete a sub-assembly which may be pre-tested prior to assembly in the unit. It also places the resistors which are high heat generators on the outside of the enclosure, thus shielding the electronic components within from the heat. Metallic screen wire 63 can be supported around the flange 26 and the member 21 to shield the resistors against fields.

The foregoing specification sets forth the invention in its preferred practical forms but the structure shown is capable of modification within a range of equivalents without departing from the invention which is to be understood is broadly novel as is commensurate with the appended claims.

The embodiments of the invention in which an exclusive property or privilege is claimed are defined as follows.

I claim:

1. A heat sink comprising
a main heat sink section,
a support section,
said main section being generally U-shaped with a bottom part and leg parts extending generally at right angles to said bottom part,
said main section having heat transfer means thereon,
said support section being generally in the form of a plate having means on one side thereof to support electronic components,
laterally extending grooves in said main section underlying said leg parts,
said support section being disposed in said grooves with a small clearance space therebetween,
an electrical insulation material disposed between said support section and said main section encapsulating said support section therein,
and means overlying said leg parts providing a closure for said heat sink.

2. A heat sink comprising
a main section,
said main section comprising a part of an enclosure,
a support section,
said main section being made of metallic material and having fins on outside thereof,
said support section having a substantially large area disposed in close proximity to a substantially large area of said main section with an electrical insulation material therebetween fixing said support section to said main section,
means on said support section to attach electronic components thereto, said components being inside said enclosure,
and dust cover closure means forming a part of said enclosure for enclosing said support section.

3. A heat sink comprising
a main section,
said main section comprising a part of an enclosure,
a support section,
said main section being made of metallic material and having heat transfer means on the outside thereof,
said support section having a substantially large area disposed in close proximity to a substantially large area of said main section with an electrical insulation material therebetween fixing said support section to said main section,
means on said support section to attach electronic components thereto, said components being inside said enclosure,
and dust cover closure means forming a part of said enclosure for enclosing said support section.

4. The heat sink recited in claim 3 wherein
said dust cover closure means comprises a shield for electromagnetic and electrostatic fields.

5. A heat sink comprising a main section of metallic high heat conductive material,
said main section having a first member with a flat inside surface,
spaced, generally flat, lateral members each with a surface overlying each side of said inside surface and spaced therefrom defining a groove,
side portions extending from said lateral surfaces and generally perpendicular to said flat inside surface defining a channel,
fins extending outward from said first member,
some of said fins being curved,
a T-shaped support member having a bar member and a cross member,
said cross member being disposed in said groove and generally complementary in shape thereto,
an insulation material in said groove electrically insulating said support member from said main section,
and means on said support member for supporting electronic components.

6. The heat sink recited in claim 5 wherein
a closure member is provided,
said closure member being generally channel shaped,
one side of said closure member having a hinge member integrally attached thereto,
a hinge member integral with said main section,
said hinge member swingably connecting said closure member to said main section,
electronic components attached to said closure member,
and a component board made of insulation material in said heat sink attached to said main section and overlying said support member.

7. The heat sink recited in claim 6 wherein
one said lateral member has a flange thereon,
and an opening in said flange,
said board having resistors comprising a part of said electronic components attached thereto,
said resistors being disposed in said opening wherein said board is in operative position in said enclosure member.

8. The sink recited in claim 7 wherein
an enclosure is disposed around said resistors and a metallic screen covers said enclosure.

9. A heat sink comprising
a main section and a support section each made of high heat conductivity material,
said main section having a first member having a generally flat side and a side with fins with radiused surfaces extending therefrom,
said fins being curved generally sinusoidally,
spaced, lateral members each having a generally flat side adjacent said flat side of said first member and spaced therefrom defining grooves,
said lateral members being finned and connected to said first member along their outer edges,
side portions extending from said lateral members,
fins extending outwardly from said side portions generally parallel to said first member,
a support member having a flat side adjacent said first mentioned flat side and portions disposed in said grooves and spaced from said first member,
a material having high heat conductivity and low electrical conductivity between said first member and said support member,
and electronic components attached to said support member.

References Cited by the Examiner

UNITED STATES PATENTS

| | | | |
|---|---|---|---|
| 2,815,472 | 12/1957 | Jackson et al. | 317—100 X |
| 2,984,774 | 5/1961 | Race. | |
| 2,994,203 | 8/1961 | Lackey et al. | 317—100 X |
| 3,013,186 | 12/1961 | Jones | 317—100 |
| 3,022,448 | 2/1962 | Mason | 317—100 X |
| 3,171,069 | 2/1965 | Koltuniak et al. | 317—100 X |
| 3,300,296 | 8/1965 | Bruestle | 317—100 |

ROBERT K. SCHAEFER, *Primary Examiner.*

KATHLEEN H. CLAFFY, *Examiner.*

M. GINSBURG, *Assistant Examiner.*